US012261077B2

(12) United States Patent
Sugisaki et al.

(10) Patent No.: US 12,261,077 B2
(45) Date of Patent: Mar. 25, 2025

(54) WORK STAGE AND EXPOSURE APPARATUS

(71) Applicant: USHIO DENKI KABUSHIKI KAISHA, Tokyo (JP)

(72) Inventors: Shunta Sugisaki, Tokyo (JP); Yohei Nawaki, Tokyo (JP)

(73) Assignee: USHIO DENKI KABUSHIKI KAISHA, Tokyo (JP)

( * ) Notice: Subject to any disclaimer, the term of this patent is extended or adjusted under 35 U.S.C. 154(b) by 183 days.

(21) Appl. No.: 18/161,804

(22) Filed: Jan. 30, 2023

(65) Prior Publication Data
US 2023/0253234 A1   Aug. 10, 2023

(30) Foreign Application Priority Data
Feb. 10, 2022   (JP) ................... 2022-019342

(51) Int. Cl.
*G03F 7/20* (2006.01)
*G03F 7/00* (2006.01)
*H01L 21/683* (2006.01)

(52) U.S. Cl.
CPC ...... *H01L 21/6838* (2013.01); *G03F 7/70716* (2013.01)

(58) Field of Classification Search
CPC ............ H01L 21/6838; H01L 21/6875; G03F 7/70716; G03F 7/707; G03F 7/70916
See application file for complete search history.

(56) References Cited

U.S. PATENT DOCUMENTS

| | | | | |
|---|---|---|---|---|
| 2008/0111984 A1* | 5/2008 | Shibuta | ................... | G03F 7/707 355/75 |
| 2012/0062862 A1* | 3/2012 | Wahlsten | .............. | G03F 7/2053 355/52 |
| 2016/0111318 A1* | 4/2016 | Ichinose | ............. | G03F 7/70733 269/21 |

FOREIGN PATENT DOCUMENTS

JP   H08-195428 A   7/1996

* cited by examiner

*Primary Examiner* — Mesfin T Asfaw
(74) *Attorney, Agent, or Firm* — Studebaker Brackett PLLC

(57) ABSTRACT

Disclosed herein is a work stage for holding an organic substrate and an exposure apparatus using the work stage. The work stage comprises: a base having a recess into which vacuum is supplied; a number of substrate holding sections arranged inside the recess and configured to hold an approximately entire surface of the organic substrate; and an intake hole configured to supply vacuum into the recess and allow the substrate holding sections to vacuum suction the organic substrate on top surfaces of the substrate holding sections.

7 Claims, 12 Drawing Sheets

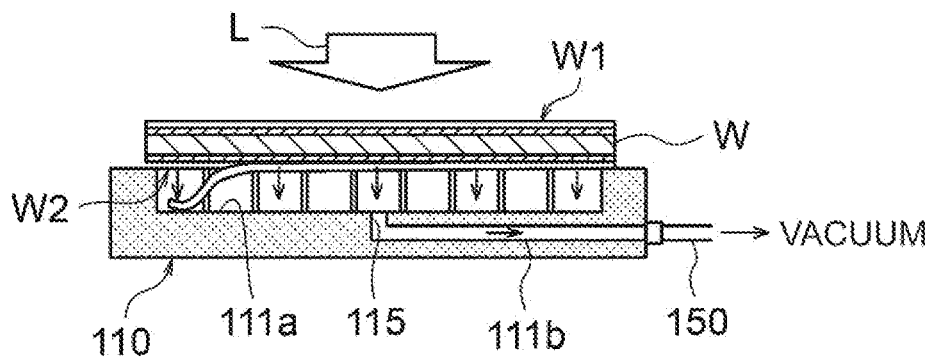
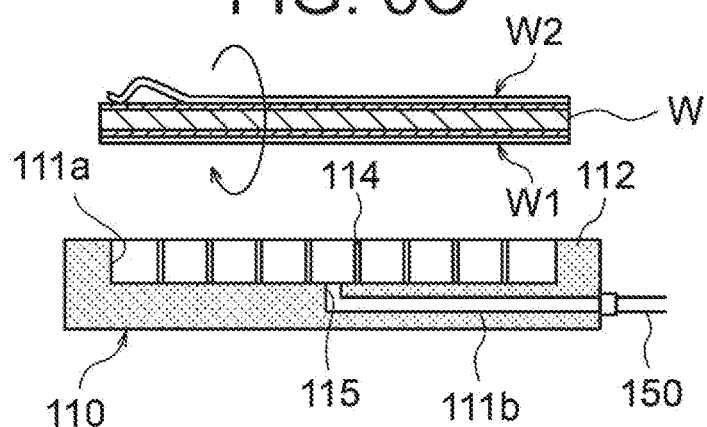
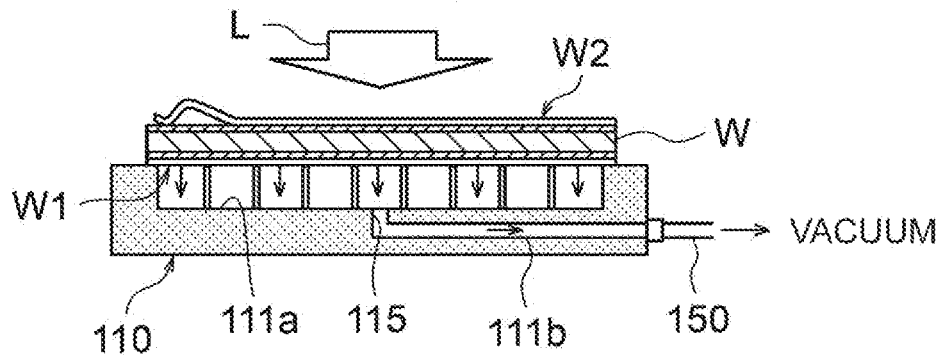

WORK STAGE AND EXPOSURE APPARATUS

CROSS-REFERENCE TO RELATED APPLICATIONS

This application is related to and claims priority under 35 U.S.C. 119 (a) to Japanese patent application No. 2022-019342, filed on Feb. 10, 2022, of which disclosure including the specification, drawings and abstract is incorporated herein by reference in its entirety.

TECHNICAL FIELD

The present invention relates to a work stage that holds a substrate onto which exposure or other processing is applied and an exposure apparatus using the work stage.

BACKGROUND ART

In the processes of manufacturing workpieces such as semiconductors, printed circuit boards, and liquid crystal substrates, a work stage is used to hold a workpiece by suction such that the workpiece would not be displaced during the exposure or other processing.

For example, Patent Literature 1 discloses a so-called pin stage (i.e., pin chuck) that holds a workpiece (e.g., wafer) solely by a number of protrusions whose top surfaces are on the same plane, as a vacuum suction apparatus used in manufacturing LSI circuits. As disclosed in Patent Literature 1, conventionally, such pin stage has been widely used in the pre-processing of semiconductor manufacturing.

On the other hand, in the post-processing of semiconductor manufacturing, conventionally, a planar stage (i.e., vacuum chuck) with multiple vacuum suction holes formed on a surface of the planar stage has been used.

LISTING OF REFERENCES

Patent Literature

PATENT LITERATURE 1: Laid-open Publication of Japanese Patent Application No. Hei-8-195428 A

SUMMARY OF THE INVENTION

Problems to be Solved by the Invention

Work stages are required to securely hold a workpiece mounted on the work stage by suction and keep the workpiece being held by suction to be flat.

However, during the processing using the planar stage described above, foreign substances are likely to enter between the workpiece and the work stage. Such foreign substances may include, for example, debris or Fall Material (FM) of organic substrates, which are used in semiconductor packages (PKG).

When foreign substrates are trapped between the workpiece and the work stage, the workpiece is likely to be deformed and raised. At this time, defocusing occurs in the raised area on the workpiece, thereby causing exposure defects. As a result, the yield rate is likely to be deteriorated.

The present invention has been made in order to solve the above mentioned problems and an object thereof is to provide a work stage and an exposure apparatus using the work stage that are capable of suppressing foreign substances from being trapped and appropriately holding a workpiece consisting of an organic substrate flat.

Solution to Problems

In order to solve the above mentioned problems, according to one aspect of the present invention, there is provided a work stage for holding an organic substrate, comprising: a base having a recess into which vacuum is supplied; a number of substrate holding sections arranged inside the recess and configured to hold an approximately entire surface of the organic substrate; and an intake hole configured to supply vacuum into the recess and allow the substrate holding sections to vacuum suction the organic substrate on top surfaces of the substrate holding sections.

Thus, by configuring the work stage to vacuum suction and hold the organic substrate (i.e., workpiece) with a number of substrate holding sections, it makes it possible to reduce the area of contact between the workpiece and the work stage, and to suppress foreign substances from being trapped between the workpiece and the work stage. As a result, it makes it possible to appropriately hold the workpiece flat.

The work stage may further comprise a plurality of partition walls provided in a peripheral region inside the recess, the peripheral region being adjacent to an edge of the recess, and the plurality of partition walls being arranged in multiple tiers in a direction from the edge of the recess toward a center of the recess.

In this case, it makes it possible to hold a film side of the workpiece laminated with easily peelable films, or the like, by suction, and even when an edge of the film peels off, it makes it possible to suppress the peeling thereof from progressing by the partition walls. In other words, it makes it possible to suppress the film from largely peeling off from the edge toward the center of the film.

Furthermore, in the above work stage, the number of substrate holding sections may be arranged in a center region inside the recess that corresponds to a processing region of the organic substrate, and the plurality of partition walls may be arranged in the peripheral region that is set outside the center region inside the recess and corresponds to a non-processing region of the organic substrate.

In this case, it makes it possible to keep the peeling of the above film, or the like, within the non-processing region of the workpiece so as to suppress the peeling of the film from progressing beyond the non-processing region into the processing region of the workpiece. As a result, it makes it possible to appropriately hold the workpiece flat in the processing region of the workpiece.

Yet furthermore, in the above work stage, each of the plurality of partition walls may be provided with a cutout that constitutes an intake path to the intake hole.

In this case, there is no need to provide intake holes both on the inside and the outside, respectively, across the partition walls. In addition, it makes it possible to draw vacuum (evacuate) both on the inside and the outside uniformly across the partition walls.

Yet furthermore, in the above work stage, the plurality of partition walls may include a first partition wall provided with a cutout; and a second partition wall arranged on a center side of the recess than the first partition wall and provided with a second cutout, and the second cutout may be arranged at a position to divert the intake path constituted with the first cutout to the intake hole.

In this case, by diverting the intake flow in such a way, it makes it possible to hold the film side of the workpiece laminated with easily peelable films, or the like, by suction, and even when the edge of the film, or the like, peels off, it makes it possible to appropriately suppress the above peeling of the film from progressing by the second partition wall arranged on the center side of the recess.

Yet furthermore, in the above work stage, a distance between the partition walls may be equal to or less than a distance between the substrate holding sections.

In this case, it makes it possible to appropriately suppress the workpiece from deflecting between the partition walls.

Yet furthermore, in the above work stage, a width of the cutout may be equal to or less than a distance between the substrate holding sections.

In this case, it makes it possible to appropriately suppress the workpiece from deflecting at the cutout provided in the partition walls.

Yet furthermore, in the above work stage, an outer forming the recess, the substrate holding sections, and the partition walls may have the same height as each other.

In this case, it makes it possible to further appropriately hold the workpiece flat by vacuum suction.

According to another aspect of the present invention, there is provided an exposure apparatus, comprising: a light irradiation unit configured to emit exposure light; a mask stage configured to hold a mask on which a pattern is formed; and a work stage configured to hold an organic substrate onto which the pattern formed on the mask is transferred, and the work stage being the work stage according to any one of the above.

Thus, according to the exposure apparatus using the work stage that is capable of appropriately holding a workpiece flat, it makes it possible to appropriately suppress exposure defects caused by defocusing so as to avoid yield rate to be deteriorated.

Advantageous Effect of the Invention

According to the work stage of the present invention, it makes it possible to suppress foreign substances from being trapped and appropriately hold a workpiece consisting of an organic substrate flat.

In addition, according to the exposure apparatus using such a work stage, it makes it possible to suppress exposure defects so as to suppress the yield rate from being deteriorated.

The above mentioned and other not explicitly mentioned objects, aspects and advantages of the present invention will become apparent to those skilled in the art from the following embodiments (detailed description) of the invention by referring to the accompanying drawings and the appended claims.

BRIEF DESCRIPTION OF DRAWINGS

FIG. 6B is a schematic diagram illustrating an exemplary operation performed by the exposure apparatus using the pin stage.

FIG. 6C is a schematic diagram illustrating an exemplary operation performed by the exposure apparatus using the pin stage.

FIG. 6D is a schematic diagram illustrating an exemplary operation performed by the exposure apparatus using the pin stage.

DESCRIPTION OF EMBODIMENTS

Figure 1:
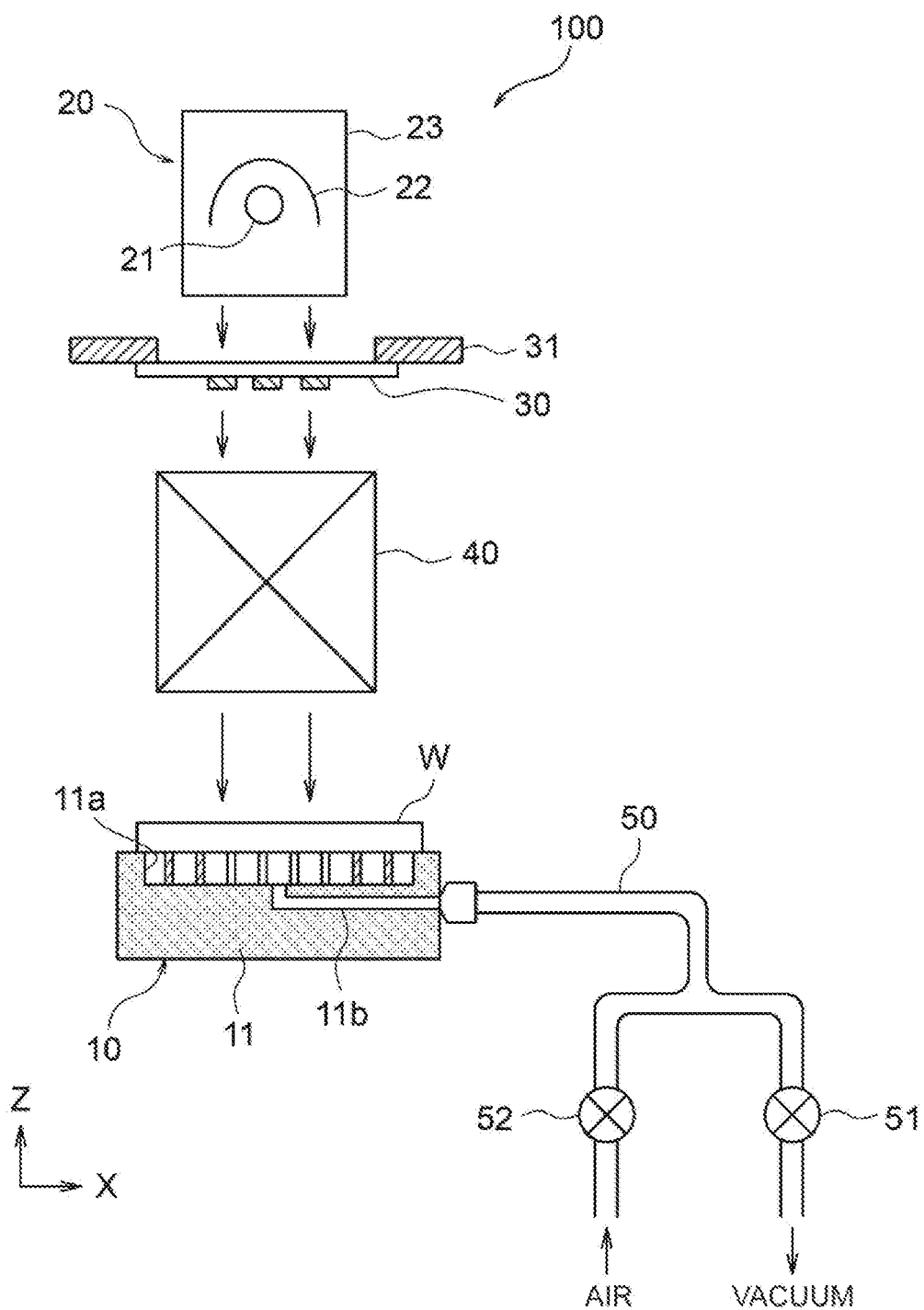
FIG. 1 is a schematic diagram illustrating an exemplary outline configuration of an exposure apparatus with a work stage according to the present embodiment.

Hereinafter, non-limiting embodiments of the present invention will be described in detail with reference to the accompanying drawings. Among the constituent elements disclosed herein, those having the same function are denoted by the same reference numerals, and a description thereof is omitted. It should be noted that the embodiments disclosed herein are illustrative examples as means for implementing the present invention, and should be appropriately modified or changed depending on a configuration and various conditions of an apparatus to which the present invention is applied, and the present invention is not limited to the following embodiments. Furthermore, it should be noted that all of the combinations of features described in the following embodiments are not necessarily essential to the solution of the present invention.

Hereinafter, embodiments according to the present embodiment will be described in detail with reference to the drawings.

Although the present embodiment will describe a certain example of a work stage to be used for an exposure apparatus, the present embodiment is not limited thereto and the work stage described herein may be used for any apparatus that holds and processes an organic substrate by vacuum suction other than the exposure apparatus.

FIG. 1 is a schematic view illustrating an exemplary outline configuration of an exposure apparatus 100 equipped with a work stage 10 according to the present embodiment.

The exposure apparatus 100 is an exposure apparatus that exposes a workpiece W consisting of an organic substrate. Here, the workpiece W may be, for example, a printed circuit board.

As shown in FIG. 1, the exposure apparatus 100 includes a work stage 10, a light irradiation unit 20, a mask 30, a mask stage 31 that holds the mask 30, and a projection lens 40.

The light irradiation unit 20 includes a lamp 21, which is a light source for exposure that emits light including ultraviolet light, and a mirror 22 that reflects light from the lamp 21. The lamp 21 and the mirror 22 are accommodated in a lamp house 23. Although a certain example in which the light source of the light irradiation unit 20 is the lamp 21 will be described herein, alternatively, the light source may be an LED, a laser, or the like.

The mask 30 has a pattern, such as a circuit pattern, to be exposed (i.e., transferred) onto the workpiece W. The exposure light from the light irradiation unit 20 is irradiated through the mask 30 and the projection lens 40 onto the workpiece W held by the work stage 10, and the pattern formed on the mask 30 is projected and exposed onto the workpiece W.

It should be noted that, although the present embodiment will describe a certain example in which the exposure apparatus 100 is equipped with the projection lens 40, alternatively, the work stage 10 according to the present embodiment may be applied to an exposure apparatus without the projection lens 40.

The work stage 10 is equipped with a base (e.g., base plate) 11 with a recess 11a formed in the center of the base 11. The base 11 may be made of, for example, aluminum.

A piping 50 is connected to the work stage 10. Air and vacuum are connected to the piping 50, and by opening and closing a first valve 51 and a second valve 52 of the piping 50, vacuum and air can be switched to be supplied to the base 11.

A vacuum air introduction channel 11b is formed inside the base 11, and vacuum or air supplied to the piping 50 is supplied to the recess 11a through the vacuum air introduction channel 11b.

Hereinafter, an exemplary configuration of the work stage 10 will be described in detail below.

Figure 2:
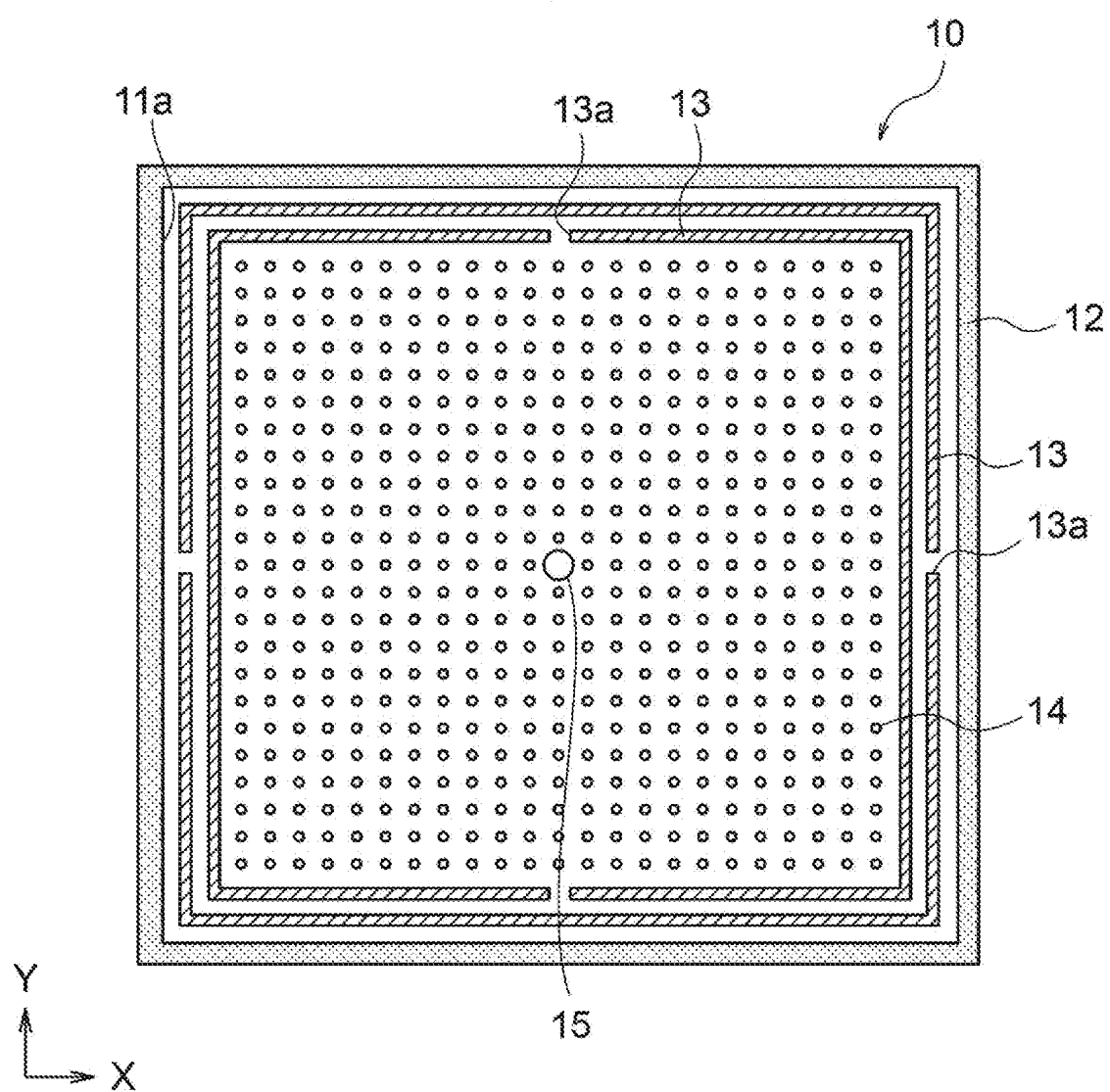
FIG. 2 is a plan view illustrating an exemplary configuration of the work stage.
Figure 3:
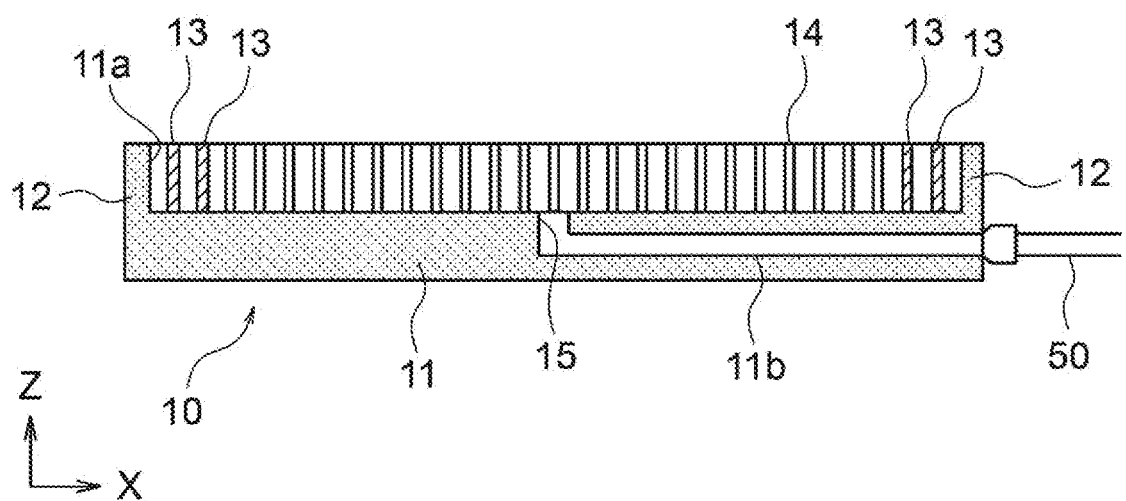
FIG. 3 is a side view illustrating an exemplary configuration of the work stage.

FIG. 2 is a plan view illustrating an exemplary configuration of the work stage 10, and FIG. 3 is a side view illustrating an exemplary configuration of the work stage 10.

The base 11 of the work stage 10 is a plate-shaped member having, for example, a rectangular shape. It should be noted that the shape of the base 11 is not limited to the rectangular shape.

The base 11 has an outer periphery 12 formed at its outer edge protruding toward a side of a suction surface of the workpiece W (i.e., upward direction in FIG. 3). The outer periphery 12 is formed around the entire circumference of the base 11, and thus the outer periphery 12 forms the recess 11a in the base 11.

Partition walls 13 are provided inside the recess 11a and adjacent to the edge of the recess 11a, and a number of substrate holding sections 14 are arranged inside the recess 11a and in the center of the recess 11a.

The partition walls 13 are arranged in multiple tiers in the direction from the edge of the recess 11a toward the center of the recess 11a. According to the present embodiment, the partition walls 13 are doubly formed with predetermined spacing inwardly from the outer periphery 12.

The inner partition wall 13 and the outer partition wall 13 are each provided with at least one cutout 13a. According to the present embodiment, the partition walls 13 are each provided with two cutouts 13a. More specifically, the outer partition wall 13 is provided with cutouts 13a at opposite positions in the X direction, respectively, and the inner partition wall 13 is provided with cutouts 13a at opposite positions in the Y direction, respectively.

It should be noted that the number of partition walls is not particularly limited, as long as at least two-tiered partition walls 13 are arranged.

Each of the substrate holding sections 14 forms, for example, a pin-shaped convex portion. The substrate holding sections (hereinafter also referred to as "pins") 14 are aligned and arranged at predetermined spacing in the X and Y directions, respectively, for example, as shown in FIG. 2.

It should be noted that the shape and arrangement of the substrate holding sections 14 is not limited to the above. For example, the shape of each of the substrate holding sections 14 may be cylindrical, conical, prismatic, pyramidal, or the like.

An intake hole 15, which serves as the edge of the vacuum air introduction channel 11b, is formed on the bottom surface of the recess 11a. Although, in FIG. 2, the work stage 10 is shown with only a single intake hole 15 in the center of the recess 11a, the number and position of the intake holes 15 are not limited to the above. It may suffice as long as the intake hole 15 is provided at least at the center of the work stage 10.

Furthermore, the outer periphery 12, the partition walls 13, and the pins 14 have the same height as each other in the Z direction. The top surface of the outer periphery 12, the top surface of the partition walls 13, and the top surface of the pins 14 collectively constitute a mounting surface on the work stage 10 for the workpiece W. When the workpiece W is mounted onto the above mounting surface, the work stage 10 is able to hold the workpiece W by suction, by vacuum exhausting (evacuating) a space formed between the workpiece W and the recess 11a.

The mounting surface of the work stage 10, in other words, a plane that includes the top surface of the outer periphery 12, the top surface of the partition walls 13, and the top surface of the pins 14, is finished to a highly precision flat surface. For example, the mounting surface of the work stage 10 is machined into an ultra-planar surface by highly precision lapping.

Figure 4:
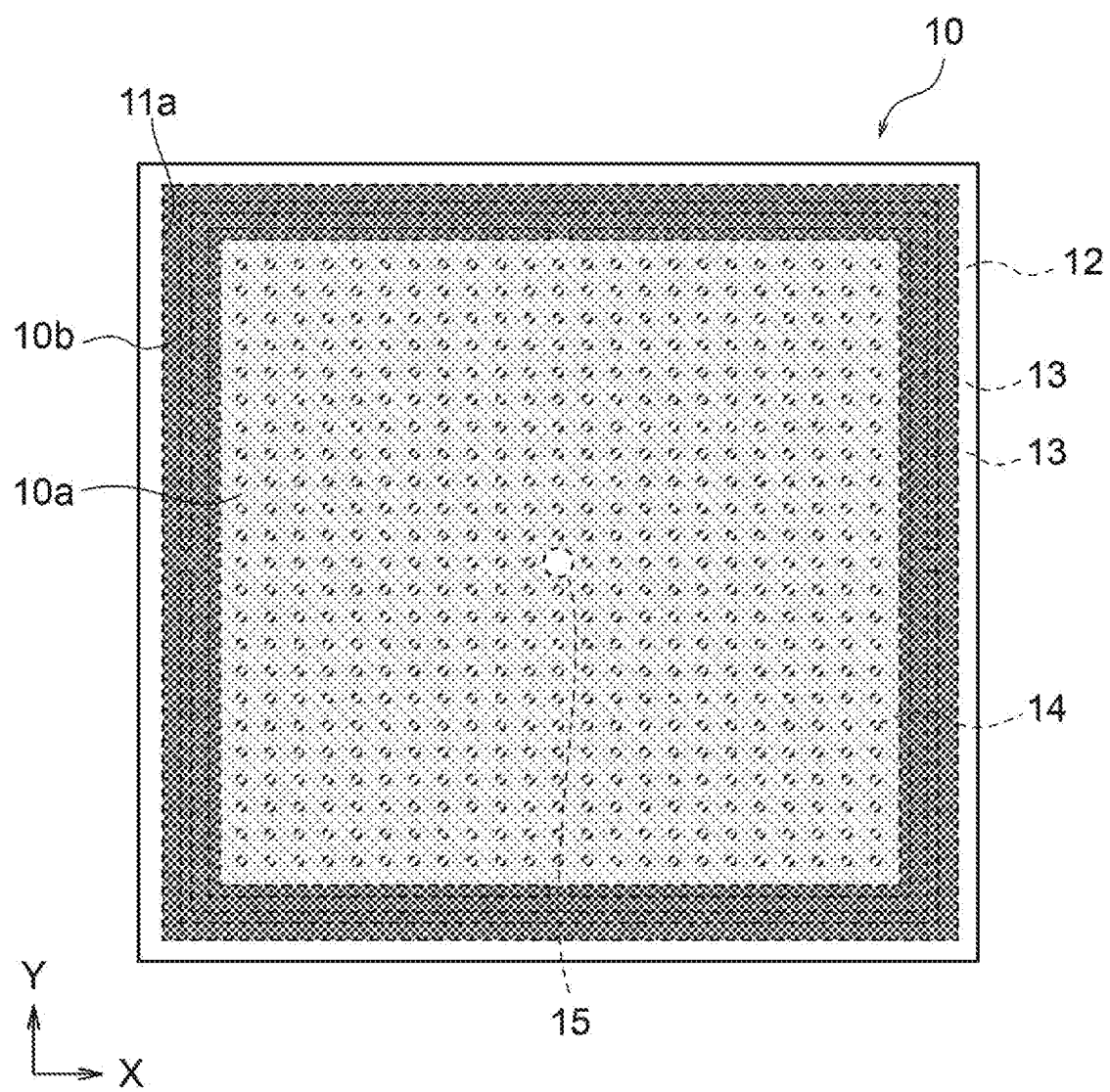
FIG. 4 is a schematic diagram exemplarily illustrating a center region and a periphery region of the work stage.

As shown in FIG. 4, the recess 11a consists of a center region 10a on which the pins 14 are arranged and a peripheral region 10b that is the periphery of the center region 10a and is provided with the partition walls 13. The center region 10a corresponds to a processing region (e.g., to-be-exposed region) that is provided over an approximately entire surface of the workpiece W, and the peripheral region 10b corresponds to a relatively small non-processing region that is provided outside the processing region of the workpiece W. In other words, the workpiece W is mounted onto the work stage 10 such that the to-be-exposed region of the workpiece W is positioned within the center region 10a, and the approximately entire surface of the workpiece W is held by the pins 14.

Preferably, the diameter or length of one side of each of pins 14 (hereinafter referred to as "pin diameter") may be approximately 0.2 mm to 1 mm. The height of the pins 14 may be several tens μm to several mm. Furthermore, the distance between pins 14 (hereinafter referred to as "pin-to-pin distance") may be preferably equal to or less than 4 mm, and for example, from 0.5 mm to 4 mm.

The width of the top surface of each of partition walls 13 (hereinafter referred to as "partition wall width") and the distance of the groove between the partition walls 13 (hereinafter referred to as "partition-to-partition distance") may be the same as the pin diameter and the pin-to-pin distance, respectively. The partition-to-partition distance may be equal to or less than the pin-to-pin distance.

The pin diameter and the pin-to-pin distance is preferably set to a value that ensures flatness that does not interfere with accuracy in exposure due to deformation (e.g., deflection) of a workpiece W when the workpiece W is held by suction. The pin diameter and the pin-to-pin distance may be set as appropriate depending on the type of the workpieces W (e.g., thickness, hardness, and the like) and cost thereof. For example, the narrower the pin-to-pin distance, the less deflection the workpiece W undergoes, resulting in the higher accuracy in exposure, while the cost is likely to increase because the number of pins 14 increases.

Also, the pin diameter is preferably set to a value that is sufficient to prevent foreign substances from adhering to the contact surface of the pins with the workpiece W.

As described above, the workpiece mounting surface of the work stage is required to be flat. However, in conventional exposure apparatuses that use a flat stage with multiple vacuum suction holes formed on the surface of the work stage, even when the work stage itself is made flat, foreign substances are likely to adhere to the workpiece mounting surface. Therefore, the workpiece is likely to be deformed by the foreign substances that enter between the workpiece and the work stage. In this case, defocusing occurs in the raised areas on the workpiece, resulting in exposure failure, thereby deteriorates the yield rate.

The work stage 10 according to the present embodiment includes the base 11, the outer periphery 12, and a plurality of pins 14 arranged in the recess 11a, which is defined in the base 11 by the outer periphery 12. The work stage 10 is configured such that, by supplying vacuum to the recess 11a, the pins 14a, which hold the approximately entire surface of the workpiece W, hold the workpiece W by vacuum suction.

This allows a much smaller area of contact between the workpiece W and the work stage 10 as compared to conventional work stages, thereby suppresses exposure defects caused by the foreign substances described above.

Figure 5:
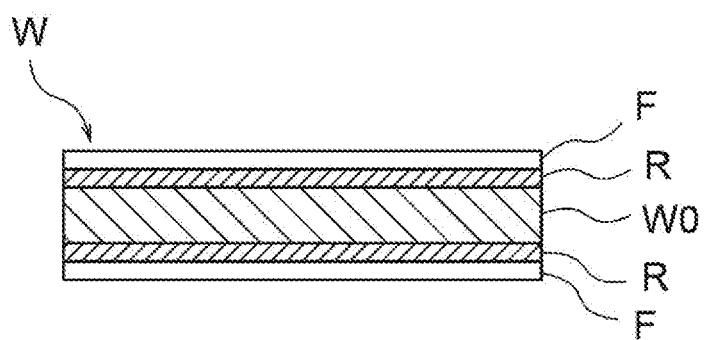
FIG. 5 is a schematic diagram illustrating an example of a workpiece.

However, some printed circuit boards have circuit patterns formed on both sides thereof. In this case, the workpiece W has a structure in which resists R are applied to both sides of the base material W0 and protective films F are laminated over the resists R, respectively, as shown in FIG. 5. It should be noted that, in FIG. 5, the thicknesses of the resist R and the film F are exaggeratingly shown for an illustrative purpose.

Here, the resist R may be, for example, a dry film resist. The protective film F may be, for example, polyethylene terephthalate (PET) film. The thickness of the resist R may be approximately 30 μm, and the thickness of the protective film F may be approximately 10 μm to 30 μm.

When using a workpiece W as shown in FIG. 5, the exposure apparatus is required to perform the exposure processing onto both sides of the workpiece W, respectively.

Assuming that the work stage concerned is not equipped with the partition walls 13 unlike the work stage 10 according to the present embodiment, in other words, the work stage concerned has a configuration in which the pins 14 are solely formed in the recess 11a, peeling of the protective films F is likely to occur in the double-sided exposure. Hereinafter, this drawback will be described in detail.

FIGS. 6A to 6D are schematic diagrams illustrating an exemplary operation performed by a certain exposure apparatus equipped with a work stage 110 without the partition walls 13.

Referring to FIGS. 6A to 6D, the work stage 110 includes an outer periphery 112, pins 114, an intake hole 115, a recess 111a, and a vacuum air introduction channel 111b, which correspond to the outer periphery 12, the pins 14, the intake hole 15, the recess 11a, and the vacuum air introduction channel 11b of the work stage 10 according to the present embodiment, respectively.

Figure 6A:
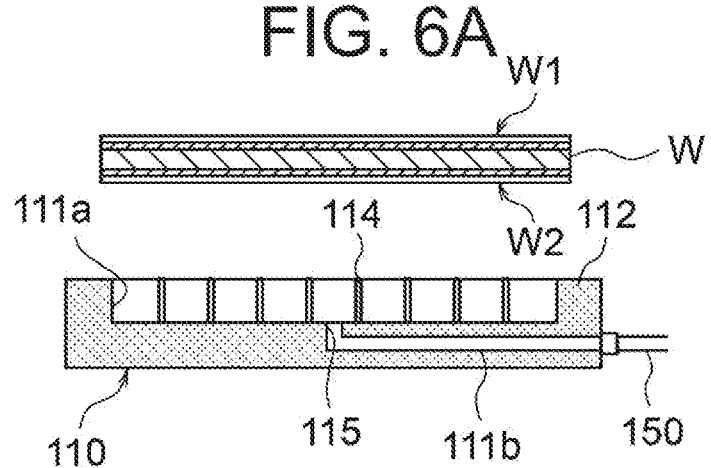
FIG. 6A is a schematic diagram illustrating an exemplary operation performed by an exposure apparatus using a pin stage.

In the exposure apparatus equipped with the work stage 110, as shown in FIG. 6A, the workpiece W is first transported onto the work stage 110 by transportation means, which are not shown. Here, the workpiece W has a structure in which the resists R are applied to both surfaces (i.e., a first surface W1 and a second surface W2) and the protective films F are laminated thereon as shown in FIG. 5.

The workpiece W transported onto the work stage 110 is then mounted on the work stage 110 with the first surface W1 as the upper face, as shown in FIG. 6B. Subsequently, the exposure apparatus supplies vacuum from the piping 150 to the recess 111a of the work stage 110. Thus, the workpiece W is held by suction on the work stage 110. In this state, the exposure apparatus irradiates the workpiece W with the exposure light L to perform the exposure processing onto the first surface W1. The exposure apparatus continues to supply vacuum to the work stage 110 so as to prevent the workpiece W from moving (i.e., misalignment) during the above exposure processing.

When the exposure processing onto the first surface W1 is completed, the exposure apparatus stops irradiating the workpiece W with the exposure light L and stops supplying vacuum to the recess 111a. As a result, the workpiece W is released from being held by suction. The workpiece W, which has been released from being held by suction, is flipped front to back, as shown in FIG. 6C, by flipping means, which are not shown, and then mounted onto the workpiece stage 110 with the second surface W2, on which the next exposure is to be performed, as shown in FIG. 6D.

Subsequently, the exposure apparatus supplies vacuum from the piping 150 to the recess 111a of the work stage 110. Thus, the workpiece W is held by suction on the work stage 110.

It should be noted that, when being irradiated with the exposure light, the resist, which is often used for printed circuit boards, becomes harder than before the exposure in the irradiated area thereof. For this reason, the exposed pattern formed by the resist is unlikely to be deformed even when the exposed surface is placed face down on the work stage.

In this state, the exposure apparatus irradiates the workpiece W with the exposure light L to perform the exposure processing onto the second surface W2. In this way, the exposure processing is performed on both sides of the workpiece W. When the exposure processing onto the second surface W2 is completed, the workpiece W is removed from the work stage 110 and transported outside the exposure apparatus by the transportation means, which are not shown, to the subsequent process of development.

In the workpiece W with the resists R being coated on both surfaces, the protective film F laminated over the resist R for protecting the resist R is unlikely to peel off in the center region thereof because the protective film F is firmly adhered to the resist R, but is likely to peel off in the peripheral edge. The critical peel strength in the center region of the protective film F is equal to or greater than 10 N, while the critical peel strength in the peripheral edge is approximately 0.2 N.

Therefore, as shown in FIG. 6B, when the workpiece W is mounted onto the work stage 110 with a surface to be exposed first (i.e., first surface W1) up and a surface to be exposed next (i.e., second surface W2) down, and vacuum is supplied from the piping 150 to the recess 111a to vacuum suction the workpiece W, the vacuum suction force may cause the peripheral edge of the protective film F to peel off. The peeling that has occurred in the peripheral edge then progresses considerably toward the center region due to the vacuum suction force.

As shown in FIG. 6B, when the protective film F peels off on the second surface W2, which is the suction surface of the workpiece W, the suction force of the workpiece W decreases and the flatness of the workpiece W decreases, thereby interferes with the exposure processing onto the first surface W1.

Furthermore, as shown in FIG. 6D, when the exposure processing is performed onto the second surface W2 of the workpiece W, the protective film F side that has peeled off during the exposure processing onto the first surface W1 becomes the to-be-irradiated surface, thereby interferes with the exposure processing onto the second surface W2.

As described above, when the work stage 110 performs the double-sided exposure processing by vacuum suctioning the workpiece W with the resists R and the protective films F being laminated on both sides, the problem of peeling of the protective film F may arise.

In contrast, according to the present embodiment, as the peripheral region 10b of the recess 11a is provided with the doubled partition walls 13, it makes it possible to suppress the protective firm F from peeling off, even when the protective film F is held by suction on the protective film F side of the workpiece W with the protective film F on the surface thereof.

FIGS. 7A to 7D are schematic diagrams illustrating an exemplary operation performed by the exposure apparatus 100 equipped with the work stage 10 according to the present embodiment.

Figure 7A:
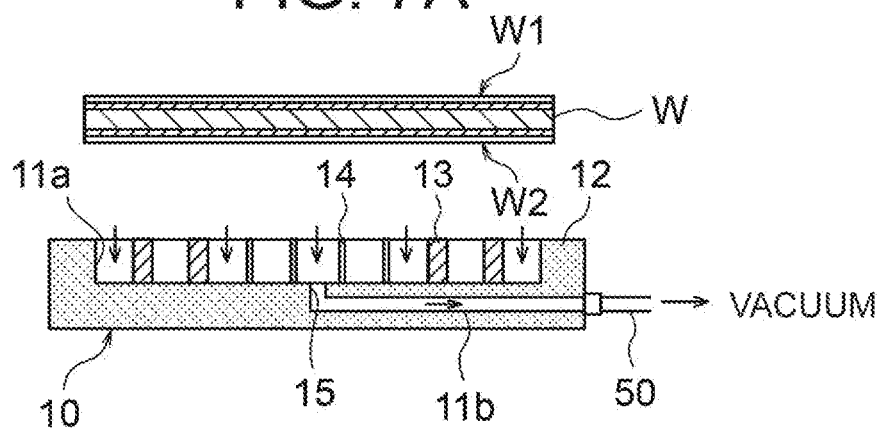
FIG. 7A is a schematic diagram illustrating an exemplary operation performed by the exposure apparatus according to the present embodiment.
Figure 7B:
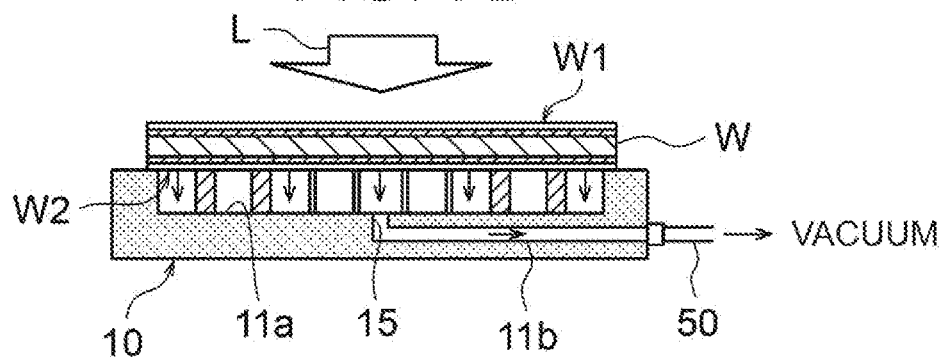
FIG. 7B is a schematic diagram illustrating an exemplary operation performed by the exposure apparatus according to the present embodiment.

As shown in FIG. 7A, the workpiece W is first transported onto the work stage 10 by transporting means, which are not shown. The workpiece W, which has been transported onto the work stage 110, is then mounted on the work stage 10 with the first surface W1 as the upper face and vacuum suctioned as shown in FIG. 7B. In this state, the exposure apparatus 10 irradiates the workpiece W with the exposure light L to perform the exposure processing onto the first surface W1.

According to the present embodiment, the exposure apparatus 100 may mount the workpiece W onto the work stage 10 while supplying vacuum from the piping 50 to the recess 11a of the work stage 10, as shown in FIG. 7A. By mounting the workpiece W onto the work stage 10 while supplying vacuum, it makes it possible to reduce the tact time.

However, when to supply vacuum is not limited to the above, and alternatively, the exposure apparatus 100 may supply vacuum to the recess 11a of the work stage 10 after the workpiece W is mounted onto the work stage 10.

During the exposure processing onto the first surface W1, the workpiece W is being pressed against the surface of the work stage 10 by vacuum suction.

The vacuum being supplied to the recess 11a goes from the vacuum air introduction channel 11b through the intake hole 15 and the center region 10a (see FIG. 4) of the recess 11a to the peripheral region 10b (see FIG. 4).

The work stage 10 according to the present embodiment is equipped with the doubled partition walls 13 in the peripheral region 10b, and the cutouts 13a, which are arranged in the doubled partition walls 13, respectively, are arranged alternately. For this reason, as advancing from the center region 10a to the peripheral region 10b, the vacuum suction force exerted onto the workpiece W becomes moderately weaker. As a result, as shown in FIG. 7B, even when the protective film F is held by suction on the protective film F side of the second surface W2, the protective film F does not peel off and the exposure processing onto the first surface W1 may be performed as appropriate.

Figure 7C:
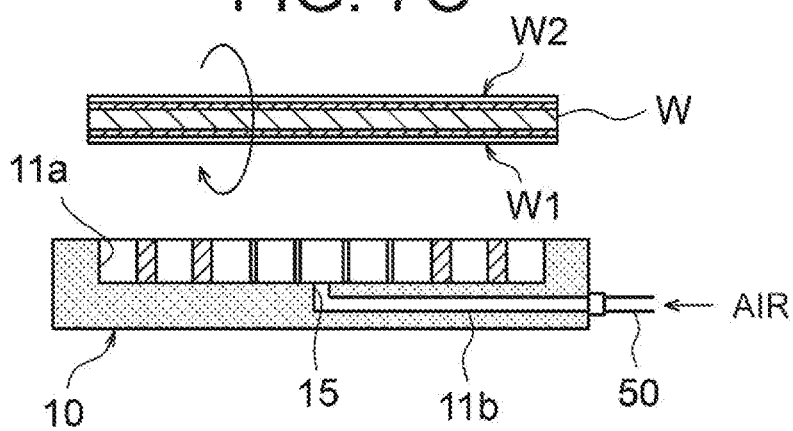
FIG. 7C is a schematic diagram illustrating an exemplary operation performed by the exposure apparatus according to the present embodiment.
Figure 7D:
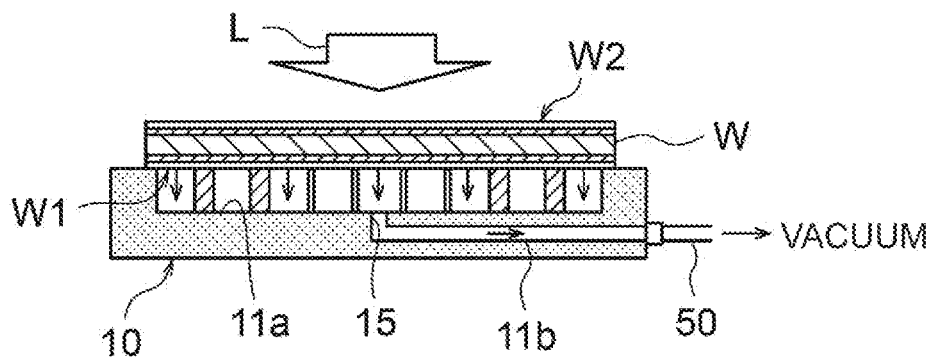
FIG. 7D is a schematic diagram illustrating an exemplary operation performed by the exposure apparatus according to the present embodiment.

When the exposure processing onto the first surface W1 is completed, the exposure apparatus 100 stops irradiating the workpiece W with the exposure light L, stops supplying vacuum to the recess 11a, and switches to supplying air. By supplying air to the recess 11a, the workpiece W is pushed up, thereby facilitating the workpiece W to be removed. The workpiece W, which has removed from the work stage 10, is flipped front to back, as shown in FIG. 7C, by the flipping means, which are not shown. Subsequently, the workpiece W is mounted onto the work stage 110 with the second surface W2 to be exposed next as the upper face, as shown in FIG. 7D, and is held by suction on the work stage 10. Subsequently, the exposure processing onto the second surface W2 is performed in the same manner.

As shown in FIG. 7B, the protective film F on the second surface W2 does not peel off during the exposure processing onto the first surface W1. Therefore, as shown in FIG. 7D, when the second surface W2 is set to be the to-be-irradiated surface, it does not interfere with the exposure processing onto the second surface W2.

Figure 8:
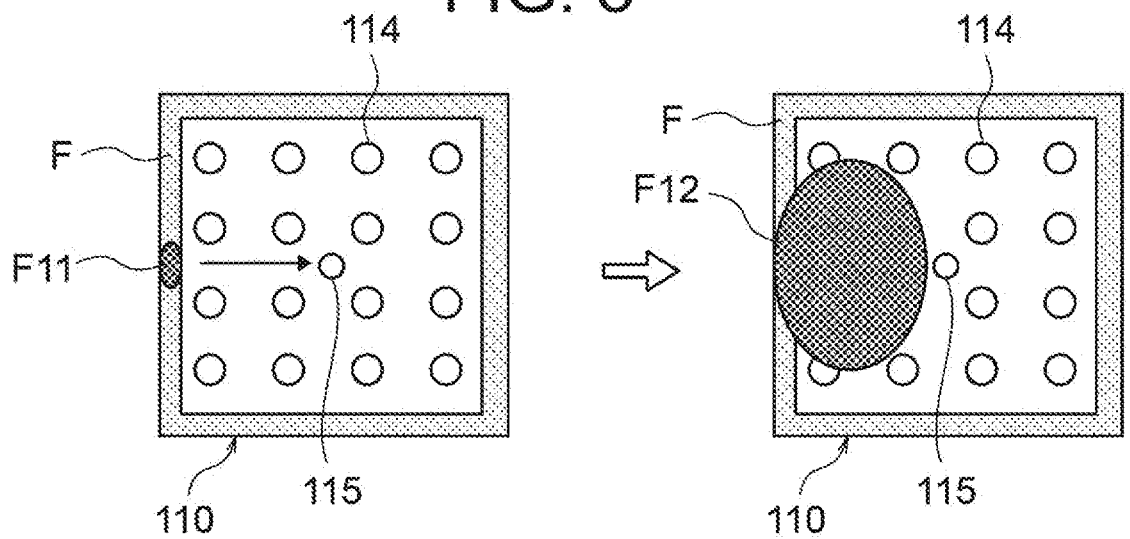
FIG. 8 is a schematic diagram illustrating an example of peeling of a protective film when using the pin stage.

In the case of the work stage 110 without the partition walls 13, when a small peeling F11 occurs at the edge of the protective film F, as shown in the left figure of FIG. 8, this peeling then progresses considerably toward the center region and becomes a larger peeling F12 as shown in the right figure of FIG. 8. This is because in the case of the work stage 110, an intake path is formed in a straight line from the edge of the work stage 110 to the intake hole 115 at the center by the pins 114, and the peeling straightforwardly progresses along this intake path.

It should be noted that, in FIG. 8, the pins 114 are exaggeratingly shown for an illustrative purpose.

Figure 9:
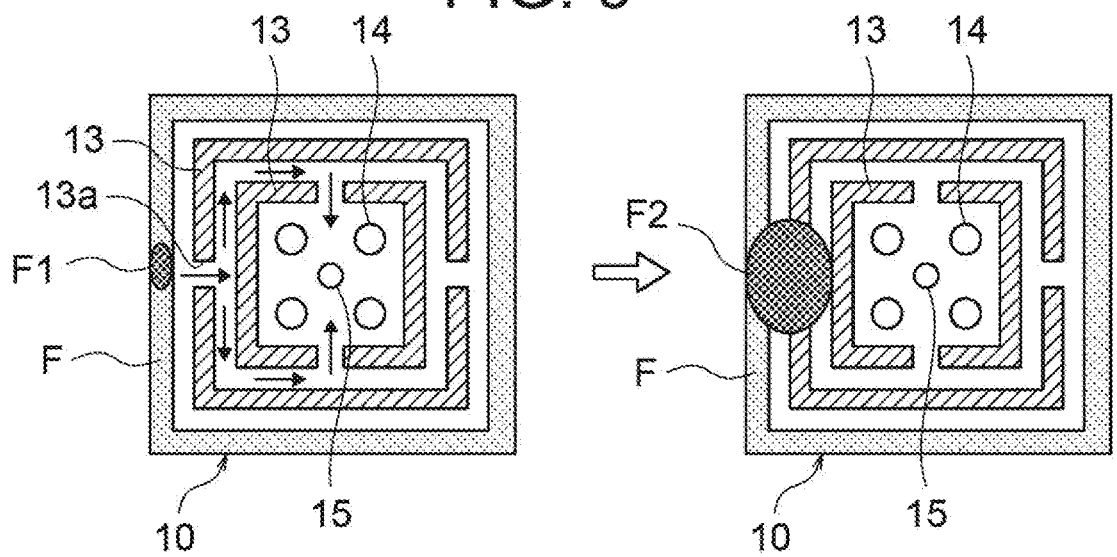
FIG. 9 is a schematic diagram illustrating an example of peeling of a protective film when using the work stage according to the present embodiment.
Figure 10:
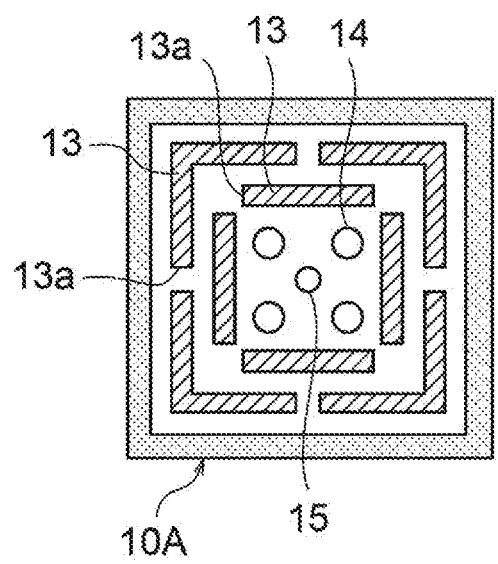
FIG. 10 is a schematic diagram illustrating another exemplary configuration of the work stage.

In contrast, in the case of the work stage 10 according to the present embodiment, as shown in the left figure of FIG. 9, even when a small peeling F1 occurs at the edge of the protective film F as well, this peeling does not progress considerably. This is because the intake path is diverted to the intake hole 15 by the partition walls 13. As shown in the left figure of FIG. 9, when the peeling F1 occurs at the position of the cutout 13a provided in the outermost partition wall 13, the peeling F1 progresses along the intake path toward the center, but its progress stops at the second partition wall 13. For this reason, it stays at a relatively small peeling F2 as shown in the right figure in FIG. 9.

In other words, the peeling that occurs at the edge of the protective film F stays in the peripheral region 10b where the partition walls 13 are arranged and does not reach the center region 10a. For this reason, the work stage 10 according to the present embodiment is able to appropriately maintain the flatness of the to-be-exposed region of the workpiece W. As a result, the exposure apparatus 100 using the work stage 10 according to the present embodiment is able to perform the exposure processing of the workpiece W excellently.

It should be noted that, in FIG. 9, the partition walls 13 and the pins 114 are exaggeratingly shown for an illustrative purpose.

As described above, the work stage 10 according to the present embodiment includes the base 11 with the recess 11a into which vacuum is supplied, a number of pins 14 arranged inside the recess 11a, and the intake hole 15 that supplies vacuum to the recess 11a. By supplying vacuum to the recess 11a, the work stage 10 vacuum suctions the approximately entire surface of the workpiece W, which is an organic substrate, on the top surfaces of the pins 14. At this time, the pin 14 holds the approximately entire surface of the workpiece W.

In this way, by configuring the work stage 10 to hold the workpiece W by vacuum suction by a number of pins 14, it makes it possible to reduce the area of contact between the workpiece W and the work stage 10, and suppress foreign substances from being trapped between the workpiece W and the work stage 10. As a result, it makes it possible to appropriately hold the workpiece W flat.

The work stage 10 according to the present embodiment may also be provided with the partition walls 13 in the peripheral region 10b, which is adjacent to the edge inside the recess 11a. The partition walls 13 may be arranged in multiple tiers in the direction from the edge of the recess 11a toward the center of the recess 11a.

With so configured partition walls 13, it makes it possible to prevent the protective film F from peeling off from the edge thereof even when the workpiece W laminated with the easily peelable protective film F is held by suction on the work stage 10 side. In addition, even when the initial peeling occurs at the edge of the protective film F during cutting or conveyance of the workpiece W, it makes it possible by the partition walls 13 to stop the peeling from progressing considerably toward the center thereof.

Furthermore, the partition walls 13 may be provided with the cutouts 13a each constituting the intake path to the intake hole 15, respectively. Here, the partition walls 13 are arranged in at least two tiers in the direction from the edge of the recess 11a to the center of the recess 11a, and the cutouts 13a are arranged alternately. In other words, when the multi-tiered partition walls 13 includes a first partition wall 13, which is provided with a first cutout 13a, and a second partition wall 13, which is arranged closer to the center of the recess 11a than the first partition wall 13 and provided with a second cutout 13a, the second cutout 13a is arranged at a position that diverts the intake path to the intake hole 15, which is constituted with the first cutout 13a.

In this way, by providing at least two tiers of the partition walls 13 and forming the cutouts 13a such that each of the cutouts 13a diverts the intake flow, it makes it possible to appropriately suppress the above peeling from progressing.

The pins 14 may be arranged in the center region 10a inside the recess 11a, which corresponds to the processing region (i.e., to-be-exposed region) of the workpiece W, and the partition walls 13 may be arranged in the peripheral region 10b inside the recess 11a, which corresponds to the non-processing region of the workpiece W.

Although the peeling that has occurred at the edge of the protective film F may progress to the position at which the innermost partition wall 13 is arranged, by arranging the partition walls 13 in a region corresponding to the non-processing region of the workpiece W, it makes it possible to keep the peeling of the protective film F within the non-processing region of the workpiece W. As a result, it makes it possible to appropriately keep holding the workpiece W flat in the processing region of the workpiece W.

Furthermore, the distance between the partition walls 13 and the width of the each of the cutouts 13a may be equal to or less than the pin-to-pin distance. In this case, it makes it possible to appropriately prevent the workpiece W from deflecting in a groove between the partition walls 13 or in the cutouts 13a.

Yet furthermore, the outer periphery 12, the partition walls 13, and the pins 14 may be situated to have the same height as each other. In this case, it makes it possible to hold the workpiece W by vacuum suction more appropriately.

As described above, the work stage 10 according to the present embodiment is able to suppress foreign substances from being trapped between the workpiece W and the work stage 10, and appropriately hold the workpiece W flat. In addition, the work stage 10 according to the present embodiment is able to appropriately suppress the film from peeling off even when the work stage 10 holds the film side of the workpiece W by suction, on which the easily peelable film is laminated.

As a result, according to the exposure apparatus 100 using such a work stage 10, it makes it possible to appropriately suppress the exposure defects due to defocusing and to avoid the yield rate to be deteriorated. In addition, it makes it possible to appropriately perform the double-sided exposure processing onto the workpiece W with film being laminated on both sides thereof.

Modifications to Embodiments

FIGS. 10 to 16 are schematic diagrams illustrating exemplary modifications to the work stage 10 according to the present embodiment, respectively. The modifications shown in FIGS. 10 to 16 can also achieve the same effects as the embodiments described above.

Although the work stage 10 shown in FIG. 2 is provided with two cutouts 13a in each of the doubled partition walls 13, alternatively, three or more cutouts 13a may be provided. For example, as in the work stage 10A shown in FIG. 10, four cutouts 13a may be provided in each of the doubled partition walls 13.

Figure 11:
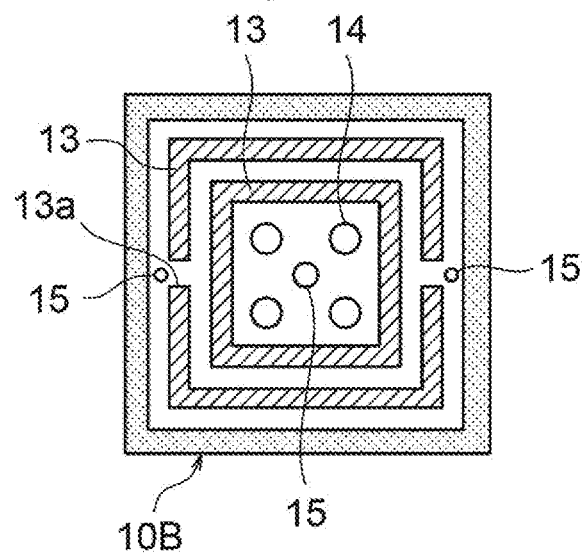
FIG. 11 is a schematic diagram illustrating yet another exemplary configuration of the work stage.

Alternatively, for example as in the work stage 10B shown in FIG. 11, the innermost partition wall 13 may not be provided with the cutouts 13a. In this case, even when the initial peeling has occurred at the edge of the protective film F that reaches the inside of the recess 11a beyond the outer partition wall 13, it makes it possible to securely stop the progress of the peeling by the innermost partition wall 13. However, in this case, another intake hole 15 is necessary to be provided in the peripheral region 10b, which is the region outside the innermost partition wall 13.

It should be noted that, although in FIG. 11 the outer partition wall 13 is provided with the cutouts 13a, alternatively, all of the partition walls 13 may be configured without the cutouts 13a. In this case, however, intake holes 15 are required to be arranged between the partition walls 13 and also between the outermost partition wall 13 and the outer periphery 12, respectively.

In this way, the work stage 10 may be configured such that the center region 10a and the peripheral region 10b of the recess 11a are separated by the partition walls 13. In this case, however, as described above, another intake hole is required to be arranged in the peripheral region 10b, and the suction force exerted onto the workpiece W needs to be controlled both in the center region 10a and the peripheral region 10b, respectively. Therefore, it is preferable to provide the cutout 13a in each of the partition walls 13 so as to allow the center region 10a and the peripheral region 10b to be communicated. The position and number of the cutouts 13a may be set as appropriate depending on the position and number of the intake holes 15.

Figure 12:
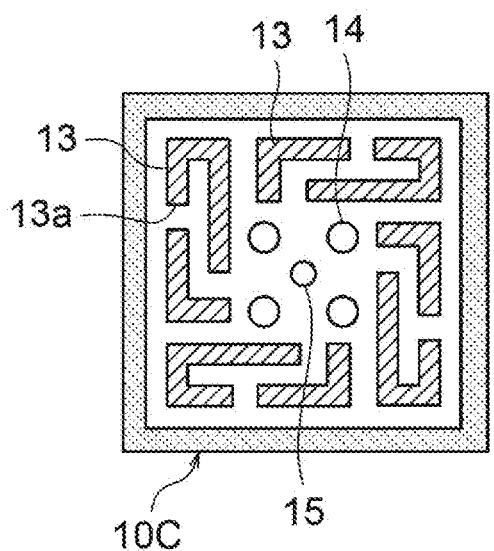
FIG. 12 is a schematic diagram illustrating yet another exemplary configuration of the work stage.

Furthermore, although in the work stage 10 shown in FIG. 2 the partition walls 13 has a doubled moat structure, alternatively, the partition walls 13 may be of any shape, as, for example, in the work stage 10C shown in FIG. 12. The partition walls 13 may be of any shape, as long as the partition walls are shaped to constitute the intake path to the intake hole 15 and to divert the intake path to the intake hole 15.

Figure 13:
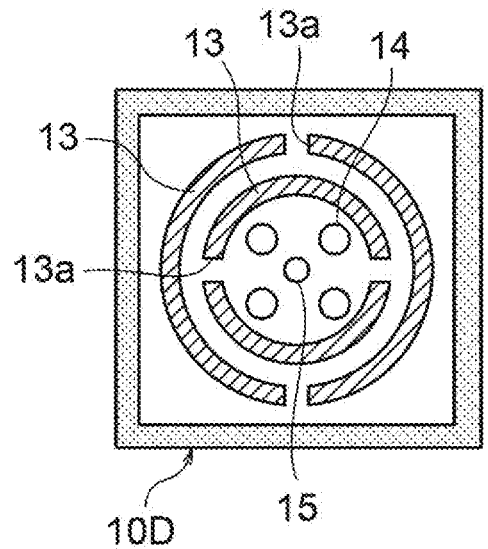
FIG. 13 is a schematic diagram illustrating yet another exemplary configuration of the work stage.
Figure 14:
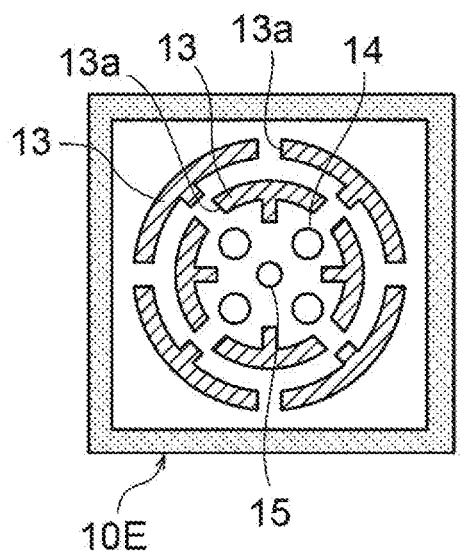
FIG. 14 is a schematic diagram illustrating yet another exemplary configuration of the work stage.
Figure 15:
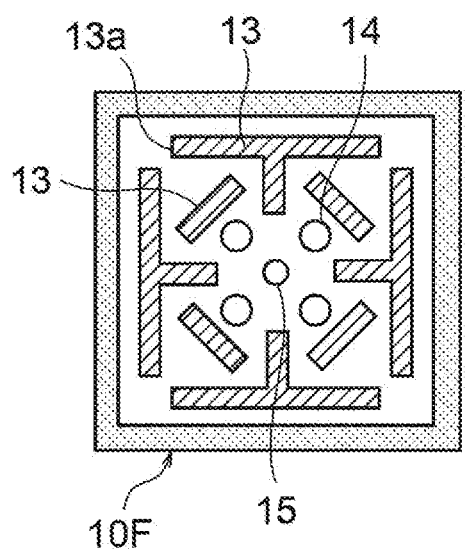
FIG. 15 is a schematic diagram illustrating yet another exemplary configuration of the work stage.

In other words, for example, as in the work stage 10D shown in FIG. 13, the partition walls 13 may be of a curved shape, or alternatively, as in the work stage 10E shown in FIG. 14, the partition walls 13 may be of a combination of straight and curved shapes. Yet furthermore, the partition walls 13 may have a complex arrangement, as in the work stage 10F shown in FIG. 15.

Figure 16:
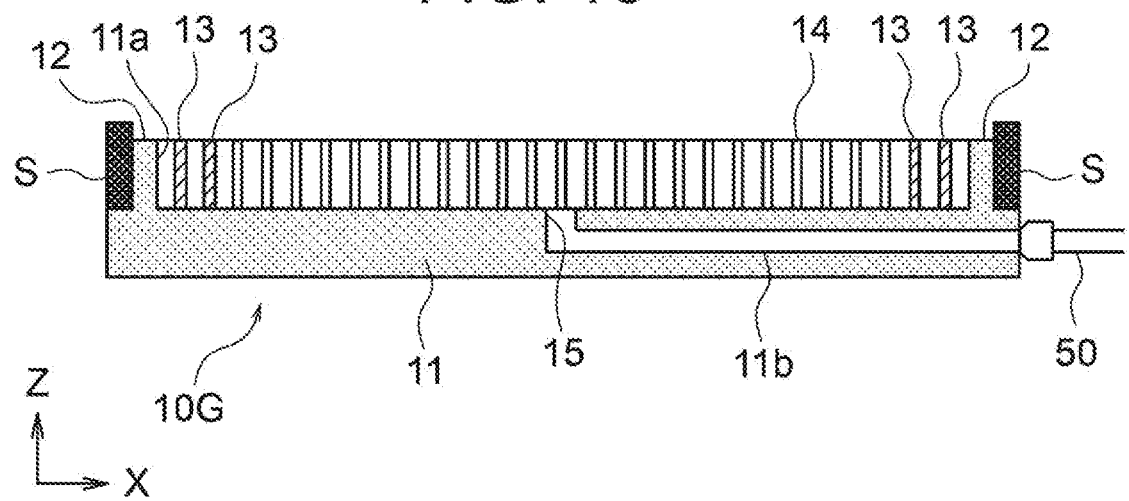
FIG. 16 is a schematic diagram illustrating yet another exemplary configuration of the work stage.

The work stage 10G, as shown in FIG. 16, may be further provided with a sealing member S. The sealing member S is a low-resilience elastic material arranged on the outside of the outer periphery 12 and may be situated around the entire circumference of the base 11. For example, the sealing member S may be made of a rubber sponge. When the workpiece W is mounted onto the work stage 10G, the sealing member S adheres to the outer circumference of the workpiece W.

Here, the height of the sealing member S may be higher than the height of the outer periphery 12, the partition walls 13, and the pins 14. In this case, when the workpiece W is vacuum suctioned to the work stage 10G, the sealing member S is pushed down to the height of the outer periphery 12, the partition walls 13, and the pins 14, and the elastic force of the sealing member S increases the degree of adhesion between the workpiece W and the sealing member S. This allows the vacuum inside the recess 11a to be increased.

In this way, the work stage 10G is able to vacuum suction the workpiece W more appropriately. In addition, even when the peeling occurs at the edge of the protective film F on the suction surface side, it makes it possible to appropriately suppress such peeling from progressing.

In a work stage without the sealing member S, when the protective film F, for example, has initial peeling that reaches the center region 10a where the pins 14 are arranged, in case that the work stage vacuum suctions the workpiece W with the surface where the initial peeling has occurred as the suction surface, the partition walls 13 may not function as intended and the peeling is likely to further progress to a larger peeling.

In contrast, the work stage 10G equipped with the sealing member S is able to appropriately suppress the peeling from progressing even when the initial peeling occurs as described above. This is conceivable to be because the sealing member S makes the recess 11a completely closed to the atmosphere.

In the above embodiments, a certain case has been described in which the recess 11a of the work stage 10 is provided with the partition walls 13 and the pins 14. However, as shown in FIG. 5, the partition walls need not necessarily be provided, when the surface of the workpiece W is not laminated with the easily peelable protective film F, or when the double-sided exposure processing is not performed and the peeling of the protective film F on the second surface W2, which is being held by suction, does not interfere with the exposure processing onto the first surface W1.

Furthermore, in the above embodiments, a certain case has been described in which each of the substrate holding sections 14 is of a pin shape. However, the substrate holding section 14 is not limited to the pin shape, but alternatively may be a pillar with a certain amount of area of contact with the workpiece W. In other words, the substrate holding section 14 may suffice as long as the area of contact thereof with the workpiece W is smaller than that of a conventional flat stage and the top surface thereof is able to suppress foreign substances from adhering thereto.

The substrate holding sections 14 may be formed by any processing method, such as machining. The processing method of the substrate holding sections 14 is not particularly limited, and the arrangement of the substrate holding sections 14 need not be equally spaced in the X and Y directions, respectively, as shown in FIG. 2.

Furthermore, the substrate holding sections 14 may be provided not only in the center region 10a inside the recess 11a, but also in the peripheral region 10b. In other words, the peripheral region 10b may be arranged in combination with the partition walls 13 and the pins 14.

Although specific embodiments have been described above, the embodiments described are illustrative only and are not intended to limit the scope of the present invention. The apparatus and method described herein may be embodied in other forms than as described above. In addition, it is also possible to appropriately omit, substitute, or modify the above described embodiments without departing from the scope of the present invention. Embodiments with such omissions, substitutions and modifications fall within the scope of the appended claims and equivalents thereof and also fall within the technical scope of the present invention.

REFERENCE SIGNS LIST

10: Work Stage; 11: Base; 11a: Recess; 12: Outer Periphery; 13: Partition Wall; 13a: Cutout; 14: Substrate Holding Section (Pin); 15: Intake Hole; 20: Light Irradiation Unit; 30: Mask; 40: Projection Lens; 50: Piping; 100: Exposure Apparatus; F: Protective Film; R: Resist; W: Workpiece

What is claimed is:

1. A work stage for holding an organic substrate, comprising:
   a base having a recess into which vacuum is supplied;
   a number of substrate holding sections arranged inside the recess and configured to hold an approximately entire surface of the organic substrate;
   an intake hole configured to supply vacuum into the recess and allow the substrate holding sections to vacuum suction the organic substrate on top surfaces of the substrate holding sections; and
   a plurality of partition walls provided in a peripheral region inside the recess, the peripheral region being adjacent to an edge of the recess, and the plurality of partition walls being arranged in multiple tiers in a direction from the edge of the recess toward a center of the recess, wherein
   an outer periphery of the base forming the recess, the substrate holding sections, and the plurality of partition walls are all of the same height.

2. The work stage according to claim 1, wherein
   the number of substrate holding sections are arranged in a center region inside the recess that corresponds to a processing region of the organic substrate, and the plurality of partition walls are arranged in the peripheral region that is set outside the center region inside the recess and corresponds to a non-processing region of the organic substrate.

3. The work stage according to claim 1, wherein each of the plurality of partition walls is provided with a cutout that constitutes an intake path to the intake hole.

4. The work stage according to claim 3, wherein the plurality of partition walls includes:
a first partition wall provided with a first cutout; and
a second partition wall arranged on a center side of the recess than the first partition wall and provided with a second cutout, and wherein
the second cutout is arranged at a position to divert the intake path constituted with the first cutout to the intake hole.

5. The work stage according to claim 3, wherein a width of the cutout is equal to or less than a distance between the substrate holding sections.

6. The work stage according to claim 1, wherein a distance between the partition walls is equal to or less than a distance between the substrate holding sections.

7. An exposure apparatus, comprising:
a light irradiation unit configured to emit exposure light;
a mask stage configured to hold a mask on which a pattern is formed; and
a work stage configured to hold an organic substrate onto which the pattern formed on the mask is transferred, and
the work stage being the work stage according to claim 1.

* * * * *